United States Patent [19]
Nishikawa et al.

[11] Patent Number: 5,274,352
[45] Date of Patent: Dec. 28, 1993

[54] THICK FILM RESISTIVE ELEMENT, THICK FILM PRINTED CIRCUIT BOARD AND THICK FILM HYBRID INTEGRATED CIRCUIT DEVICE AND THEIR PRODUCTION METHODS

[75] Inventors: Toshiaki Nishikawa; Yoshiharu Yamashita, both of Tokyo, Japan

[73] Assignee: NEC Corporation, Tokyo, Japan

[21] Appl. No.: 901,873

[22] Filed: Jun. 22, 1992

[30] Foreign Application Priority Data

Jun. 26, 1991 [JP] Japan ................................. 3-153653

[51] Int. Cl.⁵ .............................................. H01C 1/012
[52] U.S. Cl. ................................... 338/307; 338/308; 338/314
[58] Field of Search ................. 338/308, 306, 307, 314

[56] References Cited

U.S. PATENT DOCUMENTS 4,139,832  2/1979  Yoshino et al. ..................... 338/308
4,424,251  1/1984  Sugishita et al. ................. 338/308 X Primary Examiner—Marvin M. Lateef
Attorney, Agent, or Firm—Laff, Whitesel, Conte & Saret

[57] ABSTRACT

A thick film resistive element superior in moisture resistance characteristic is provided, which includes a pair of film-like conductors formed on an insulating substrate, a film-like resistor formed on the substrate so as to be partially laminated on the electrode portions of the pair of conductors thereby covering the surfaces of the electrode portions, and a first covering member formed of a material containing a crystal glass as a main ingredient thereof which covers the other portions of the pair of conductors than said electrode portions. As a result, there does not exist such an area that is covered with a porous amorphous glass film only, so that even if a protection film of an organic resin is not provided, there is no possibility that the moisture in the application environment affects on the conductors to degrade the insulation resistance therebetween. Thus, the use of this thick film resistive element makes it possible to realize a thick film printed circuit board and thick film hybrid integrated circuit device with no need to coat a protection film of an organic resin.

11 Claims, 5 Drawing Sheets

THICK FILM RESISTIVE ELEMENT, THICK FILM PRINTED CIRCUIT BOARD AND THICK FILM HYBRID INTEGRATED CIRCUIT DEVICE AND THEIR PRODUCTION METHODS

BACKGROUND OF THE INVENTION

1. Field of the Invention

This invention relates to a thick film resistive element, a thick film printed circuit board and a thick film hybrid integrated circuit device and their production methods and more particularly, to a thick film resistive element including a patterned electroconductive film and a patterned resistance film formed on an insulating substrate, a thick film printed circuit board and thick film hybrid integrated circuit device using the thick film resistive element, and their production methods.

2. Description of the Related Art

FIGS. 1a to 1e illustrate a production method of a conventional thick film hybrid integrated circuit device in the order of processing steps. The structure and production method of a conventional thick film hybrid integrated circuit device will be explained below while referring to FIGS. 1a to 1e.

First, on an insulating substrate 1 is patterned an electroconductive film 2 to form electric conductors 2a, 2b and 2c thereon as shown in FIG. 1a. As the insulating substrate 1, for example, an alumina board with a purity of 96% is used. The conductors 2a, 2b and 2c are formed in such a manner that the electroconductive film 2 is patterned on the substrate 1 by the screen printing technique using an electroconductive paste containing powdered electroconductive metal such as, for example, silver as the main component, then dried and thereafter, fired at about 850° C. As the electroconductive paste to be used, such metal powder as contains silver in the alloying form as the silver-paradium alloy or silver-platinum alloy is frequently used.

Next, a resistance film is pattern-printed on the insulating substrate 1 to form a resistor 3 so as to be partially laminated on the conductors 2b and 2c at the both ends thereof as shown in FIG. 1b. That is, the resistor 3 is laminated on the conductors 2b and 2c at the both ends and contacted to the substrate 1 between such both ends. Then, respective portions 10b and 10c of the conductors 2b and 2c on which the resistor 3 is laminatedly formed constitute electrode portions. Thus, a thick film printed circuit board consisting of thus patterned electroconductive film and resistance film can be obtained. The resistor 3 is formed, similar to the case of forming the electroconductive film 2, in such a manner that using an electrically resistive paste containing a metal oxide such as, for example, ruthenium oxide as the main component, the resistance film is patterned by the screen printing technique, then dried and thereafter, fired at about 850° C.

Besides, an amorphous glass film such as $PbO.SiO_2.B_2O_3$ is patterned on the substrate 1, thus forming covering members 4a and 4b for covering the conductors 2a, 2b and 2c and the resistor 3 as shown in FIG. 1c. One part 9a of the conductor 2b on the side of the conductor 2b is not covered with the covering member 4a to be exposed and on the other hand, one part 9b of the conductor 2b on the side of the conductor 2a is not covered with the covering member 4b to be exposed as well. Thus exposed parts 9a and 9b of the conductors 2a and 2b serve to act as a part-carrying pad portion for carrying assembling parts of a semiconductor integrated circuit device or the like, or as a terminal for connecting to external input/output terminals in the later steps of processing. The resistor 3 is completely covered with the covering members 4a and 4b.

The covering members 4a and 4b formed of amorphous glass serve to prevent the resistor 3 from being cracked when a laser beam is applied to the resistor 3 for trimming thereby to adjust its resistance value in the latter process. In addition, they serve to protect the surfaces of the resistor 3 and electroconductive film 2 as well as to act as a solder-resist in that a solder can be applied only to the necessary parts of the electroconductive film 2 when assembling parts are to be mounted thereon.

The covering members 4a and 4b are formed in such a manner that the amorphous glass film is patterned on the conductors 2a, 2b and 2c and the substrate 1 with an amorphous glass paste by the screen printing technique, then dried and thereafter, fired at about 500° C. The firing temperature such as to be about 500° C. is selected as a temperature at which the resistance of the resistor 3 being already formed is not varied. Due to the fact that the firing temperature is as low as above, the amorphous glass film thus formed is not only coarse in film quality but also porous in structure, and in some cases, small cracks may be formed therein.

Next, the resistor 3 is trimmed to adjust the resistance value, and then, as shown in FIG. 1a, an assembling part 5 is bonded through solders 6a and 6b to the respective exposed parts 9a and 9b of the conductors 2a and 2b thereby to carry it therebetween. In addition, to respective terminal connection point (not shown) is mounted an input/output terminal (not shown).

Finally, the thick film printed circuit board having the assembling part 5 thus bonded and the input/output terminal (not shown) connected thereto as shown above is dipped into an electrically insulative organic resin solution such as epoxy or phenol resin solution and heat-treated to form a protection film 7 for coating the surface of the patterned electroconductive film side of the printed circuit board. In this case, the protection film 7 covers all the conductors 2a, 2b and 2c, resistor 3, covers 4a and 4b and assembling part 5 as shown in FIG. 1e. Thus, the conventional thick film hybrid integrated circuit device is completed.

FIG. 2 is a top view partially showing the vicinity of the resistor 3 of the device shown in FIG. 1 before the assembling part 5 is mounted onto the exposed parts 9b and 9c of the conductors 2b and 2c.

With the thick film hybrid integrated circuit device as shown above, if the protection film 7 is not coated thereon, suitable moisture resistance cannot be provided, so that there arises such a problem that the insulation resistance between the conductors will be gradually degraded while being operated under high humidity environmental condition. This can be considered to be attributed partially to the structure of the films covering the conductors and the nature of the amorphous glass film.

In the above-explained thick film hybrid integrated circuit device, when considered with the protection film 7 removed, as clear from FIGS. 1e and 2, the electrode portions 10b and 10c of the conductors 2b and 2c where the resistor 3 is laminatedly formed thereon are covered with the resistor 3 itself and the covering member 4b. The part-carrying pad portions 9a and 9b of the conductors 2a and 2b are covered with the solders 6a and 6b, respectively. Besides, though not shown, the terminal connection point of each conductor is also covered with solder. The other portion of the conductor 2a than the part-carrying pad portion 9a is covered with the covering member 4a only. The other portion of the conductor 2b than the part-carrying pad portion 9b and the electrode portion 10b is covered with the covering member 4b only.

As explained above, when considered with the protection film 7 removed, the conventional thick film hybrid integrated circuit device is that the electrode portion of each conductor is covered with the resistor and the covering member of members, the part-carrying pad portion and terminal connection point of each conductor is covered with the solder film only, and the other portion of each conductor than the electrode portion, part-carrying pad portion and terminal connection point is covered with the amorphous glass film only. This amorphous glass film is, as shown above, porous and yet, may be hair-cracked in some cases, which means that if the protection film is not provided, it may be easily degraded by entering the moisture into the porous amorphous glass film while being placed under high humidity environmental condition.

The electrode portion of each conductor is covered with the resistor highly dense in film quality, and the part-carrying pad portion and terminal connection point thereof are also covered with the high density solder, which means that if the moisture is entered thereinto, it is positively prevented by the resistor or solder from being further entered, thus being capable of preventing it from being reached to the conductor. In this case, however, in the other portion of each conductor than the part-carrying pad portion and terminal connection point, the moisture may be further entered through the porous amorphous glass film and/or the boundary between the glass film and substrate, finally going to the conductor itself. As a result, the metal atoms in the conductor are caused ionized by the moisture entered, and the metal ions thus obtained are attracted to the electric field applied between each adjacent conductors, and gradually move from one conductor through the porous amorphous glass film toward the other conductor as time passes, finally reaching to the other conductor. This is a process that the insulation resistance between the conductors is degraded.

When observed an insulation resistance degraded resistor which is formed between adjacent conductors microscopically, such a trace that the metal ion moves can be found on the amorphous glass film, which shows that the above considerations are true.

The explanations were made above on the degradation of insulation resistance between the conductors caused by ionization of the metal contained in the conductor with the resistor as an example, but such phenomenon may be occurred even at any portion other than the electrode portion having the resistor bonded if the electric field is applied between the conductors.

As a result, with the conventional thick film hybrid integrated circuit device as shown above, there arises such a problem that the protection film 7 cannot be omitted because of the fact that a satisfactory reliability on the moisture resistance of insulation characteristic cannot be obtained only using the amorphous glass covering film.

In addition, with the production method of a conventional thick film hybrid integrated circuit device, the protection film 7 is coated by dipping process into an organic resin solution, so that a large quantity of such solution must be unavoidably used, resulting in an difficulty to reduce the production cost. In addition, if any defective point is found out in the assembling part 5 after coating the protection film 7, it cannot be disadvantageously replaced with, which is another reason that the production cost cannot be reduced.

This invention was made to solve the above-mentioned problems, and an object of this invention is to provide a thick film resistance element and thick film printed circuit board which are superior in moisture resistance characteristic to conventional ones and do not need to coat an organic resin to form a protection film, and their production methods.

Another object of this invention is to provide a thick film hybrid integrated circuit device which does not need to coat a protection film of an organic resin and which even if any defect is found out in an assembling part after assembled, it can be easily replaced with a new one, and its production method.

SUMMARY OF THE INVENTION (1) In a first aspect of this invention, a thick film resistive element is provided which is outstandingly superior in moisture resistance characteristic. This element comprises a pair of film-like conductors formed on an insulating substrate, a film-like resistor formed on the substrate so as to be partially laminated on the electrode portions of the pair of conductors thereby covering the surfaces of the electrode portions, and a covering member formed of a material containing a crystal glass as a main ingredient thereof such as $CaO-Al_2O_3-SiO_2$ which covers the other portions of the pair of conductors than the electrode portions.

The covering member may be formed of a crystal glass only or of a material which contains an ingredient other than a crystal glass, for example an amorphous glass.

With the thick film resistive element according to this invention, the electrode portions of the conductors are covered with the high density resistor and the other portions of them than the electrode portions are covered with the high density covering member formed of a material containing a crystal glass as a main ingredient thereof, and there does not exist such a section that is covered with a porous amorphous glass film only as in the prior art. As a result, the resistive element is extremely superior in moisture resistance, and even if a protection film formed of anorganic resin is not provided, there is no possibility that the moisture in the application environment affects on the conductors to degrade the insulation resistance therebetween.

In one preferred embodiment of this invention, the resistor is formed on the insulating substrate so as to be laminatedly extended onto the covering member at the peripheral edge thereof. The resistor may also be formed to be slightly extended outside of the electrode portions. In this case, there is no possibility that the moisture is entered from the boundary, advantageously contributing to the improvement of such moisture resistance characteristic.

Besides, in another preferred embodiment, in order to protect the resistor, a covering member formed of an amorphous glass material may be additionally formed to cover the resistor. In this case, it is preferable that the amorphous glass covering member is formed so as to cover larger than the whole surface of the resistor.

The shape of the electrode of the pair of conductors depends on the nature of the electrode portion itself on one hand, and on the relative position of the films to be laminated on the electrode portions on the other hand. If the covering member of a material containing a crystal glass as a main ingredient thereof is disposed so as to be crossed with the pair of conductors simultaneously while remaining the electrode portions to be exposed, the shapes of the electrodes are determined depending on the crystal glass covering member. This is preferable to be applied when the pair of conductors both are extended, for example, linearly and the electrodes are to be provided at the other portions of the conductors than the end portions thereof, namely, the electrodes are to be respectively provided between the both ends of the conductors.

If the covering member of a material containing a crystal glass as a main ingredient thereof is disposed so as not to be crossed with the pair of conductors simultaneously while remaining the electrode portions, namely, if disposed so as to cover the pair of conductors separately, the shapes of the electrode portions are determined depending on the resistor. This is preferable to be applied when the electrodes are to be provided at the respective ends of the pair of the conductors. In this case, it is more advantageous than the case when disposed to be crossed therewith simultaneously in that the pattern design of the resistive element can be made easier.

(2) In a second aspect of this invention, a thick film printed circuit board is provided which is outstandingly superior in moisture resistance characteristic. This circuit board comprises an insulating substrate, film-like conductors formed on the substrate, at least one film-like resistor formed on the substrate so as to be partially laminated on respective electrode portions of the conductors thereby covering the surfaces of the electrode portions, a covering member of a material containing a crystal glass as a main ingredient thereof for covering the portions of the conductors excepting the electrode portions, a part-carrying pad portion and a terminal connection point.

The thick film printed circuit board thus obtained exhibits an outstandingly superior moisture resistance characteristic for the same reasons as in the first aspect.

(3) In a third aspect of this invention, a thick film hybrid integrated circuit device is provided, which is fabricated by equipping assembling parts and input/output terminals onto the thick film printed circuit board as shown in the second aspect.

In the thick film hybrid integrated circuit device of this aspect, the thick film printed circuit board superior in moisture resistance characteristic as shown in the second aspect is introduced, and the electrode portions of the conductors are covered with the covering member, and the part-carrying pad portion and terminal connection point thereof are covered with solder, so that there does not need to coat a protection film of an organic resin. Accordingly, if any component part that is assembled is found to be defective, it can be replaced with a new one just-in-time, which means that the circuit board is reusable, leading to a vast reduction in production cost of thick film hybrid IC device.

(4) In a fourth aspect of this invention, a production method of the thick film resistor as shown in the first aspect is provided, which comprises the steps of forming a patterned electroconductive film on an insulating substrate to form a pair of conductors, forming a patterned film of a material containing a crystal glass as a main ingredient thereof on the substrate so as to have the electrode portions of the conductors respectively exposed, and forming a patterned resistance film on the substrate so as to be linked between the electrode portions and thereby bonding the resistance film to the respective electrode portions as well as covering the electrode portions therewith.

The steps are preferably realized by screen printing method, however, other methods such as direct drawing method or the like may be used.

(5) In a fifth aspect of this invention, a production method of the thick film printed circuit board is provided, which comprises the steps of forming a patterned electroconductive film on an insulating substrate to form conductors, forming a patterned film of a material containing a crystal glass as a main ingredient thereof on the substrate so that respective electrode portions of the conductors, a part-carrying pad portion and an input/output terminal connection point of the conductors are exposed, and forming a patterned resistance film on the substrate so as to be linked between the electrode portions and thereby bonding the resistance film to the respective electrode portions as well as covering the electrode portions therewith.

(6) In a sixth aspect of this invention, a production method of the thick film hybrid integrated circuit device shown in the third aspect is provided, which comprises the steps for fabricating a thick film printed circuit board as shown in the second aspect, a step for assembling parts on the circuit board, and a step for connecting input/output terminals on the circuit board.

(7) In this invention, the conductors, the resistor and the covering member of an amorphous glass preferably have about 6 μm or more in thickness, and generally have about 10 μm in thickness. The covering member of a material containing a crystal glass as a main ingredient thereof preferably have about 20 μm or more in thickness, and generally have about 35 to 40 μm in thickness.

BRIEF DESCRIPTION OF THE DRAWINGS

FIGS. 1a to 1e are diagrams for explaining in a step-by-step manner a production method of a conventional thick film hybrid integrated circuit device, of which.

FIGS. 1a is cross-sectional view partially showing the state that an electroconductive film is patterned on an insulating substrate.

FIG. 1b is a cross-sectional view partially showing the state that a resistance film is patterned on the electroconductive film on the substrate shown in FIG. 1a.

FIG. 1c is a cross-sectional view partially showing the state that on amorphous glass film is patterned on the electroconductive film and resistance film shown in FIG. 1b.

FIG. 1d is a cross-sectional view partially showing the state that an assembling component member is mounted on a part-carrying pad portion of the electroconductive film shown in FIG. 1c.

FIG. 1e is a cross-sectional view partially showing the state that a protection film is coated on the part-carrying side surface of the substrate shown in FIG. 1d for covering.

FIGS. 3a to 3d are diagrams for explaining a thick film hybrid integrated circuit device according to a first embodiment of this invention, of which, FIG. 3a is a top view showing a thick film resistive element of the thick film hybrid integrated circuit device of the first embodiment and the vicinity thereof.

FIG. 3b is a cross-sectional view of the thick film hybrid integrated circuit device taken the line A—A of FIG. 3a.

FIG. 3c is a cross-sectional view of the thick film hybrid integrated circuit device taken the line B—B of FIG. 3a.

FIG. 3d is a cross-sectional view of the thick film hybrid integrated circuit device taken the line C—C of FIG. 3a.

FIGS. 4a to 4c are diagrams for explaining a thick film hybrid integrated circuit device according to a second embodiment of this invention, of which FIG. 4a is a top view showing a thick film resistive element of a thick film hybrid integrated circuit device of the second embodiment and the vicinity thereof.

FIG. 4b is a cross-sectional view of the thick film hybrid integrated circuit device taken the line D—D of FIG. 4a.

FIG. 4c is a cross-sectional view of the thick film integrated circuit device taken the line E—E of FIG. 4a.

DESCRIPTION OF THE PREFERRED EMBODIMENTS

Figure 1A:
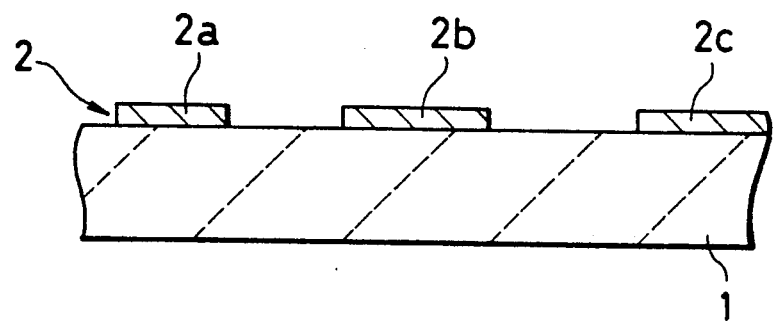
Figure 1B:
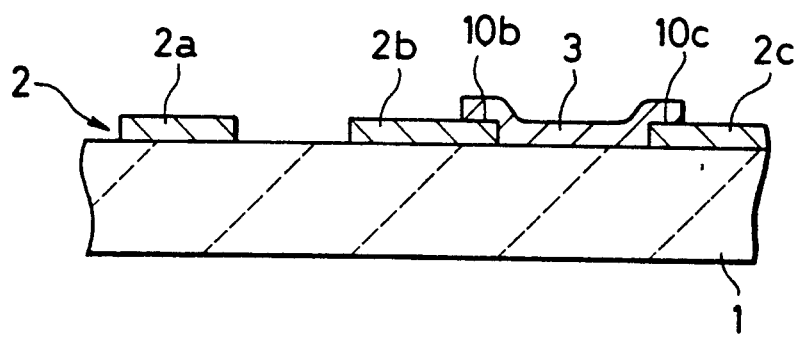
Figure 1C:
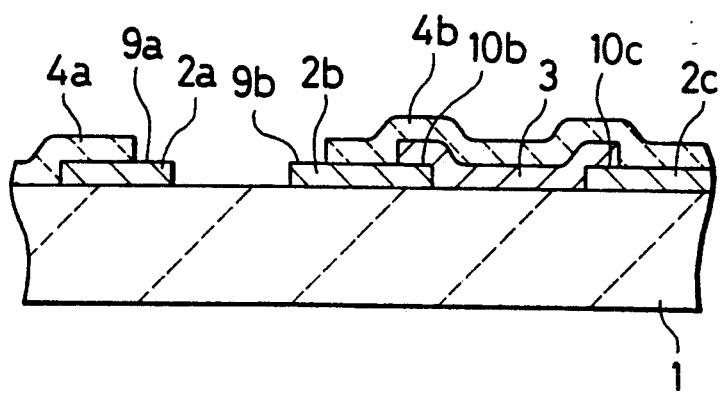
Figure 1D:
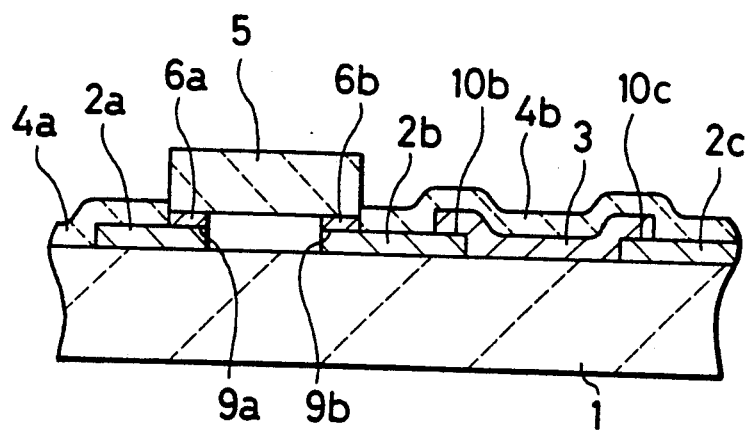
Figure 1E:
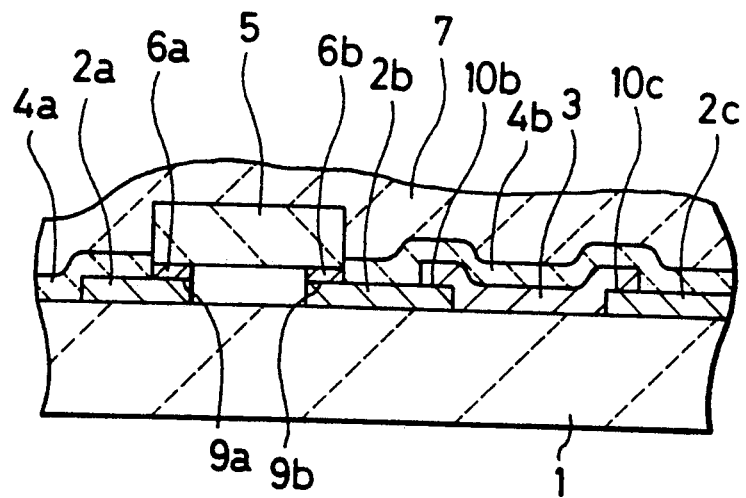
Figure 2:
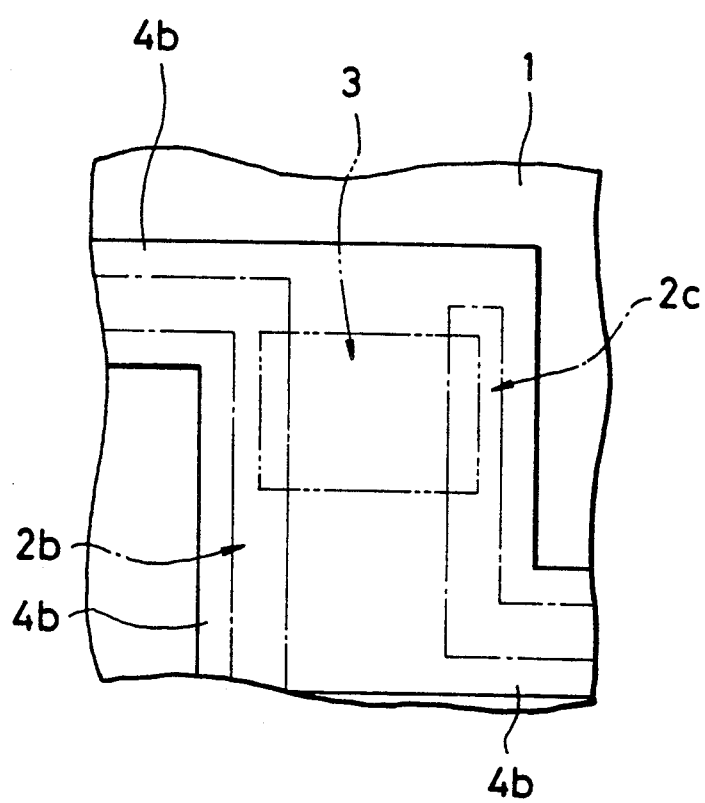
FIG. 2 is a partial top view of a conventional thick film hybrid integrated circuit device.

The preferred embodiments of this invention will be described below while referring to the drawings attached.

Structure of First Embodiment

FIGS. 3a to 3d show a thick film hybrid integrated circuit device according to a first embodiment of this invention. The integrated circuit device of this embodiment is different from a conventional one in that covering members are formed of a crystal glass.

Referring to these Figures, on an insulating substrate 11, two electric conductors 12a and 12b are patterned in substantially L-letter form. The conductors 12a and 12b are substantially in parallel and partially close to each other. On the insulating substrate 11, first covering members 18a and 18b are formed of a crystal glass. The first covering members 18a and 12b respectively cover the conductors 12a and 12b excepting such portions that are close to each other and become electrodes to which a resistor is bonded. In these Figures, the first covering members 18a and 18b cover the upper and lower parts of the conductors 12a and 12b, respectively. The lower end edge of the member 18a and the upper end edge of the member 18b are perpendicular respectively to the conductors 12a and 12b at the close portion thereof. The portions of the conductors 12a and 12b between the lower end of the covering member 18a and the upper end of the covering member 18b respectively become electrodes. As a result, in this embodiment, the electrode widths of the conductors 12a and 12b are determined depending on the crystal glass members 18a and 18b.

A rectangular resistor 13 is formed between the electrode portions of the conductors 12a and 12b on the substrate 11 so as to connect the electrode portions thereof with each other. The both ends of the resistor 13 in the lengthwise direction (direction of connecting the both electrode portions) are slightly extended respectively from the electrode portions of the conductors 12a and 12b for covering the electrode portions completely. The resistor 13 is contacted to the surface of the insulating substrate 11 between both the electrodes as well as at the slightly extended ends therefrom. As a result, the electrode portions are allowed to be confirmedly protected by the resistor 13.

Figure 3A:
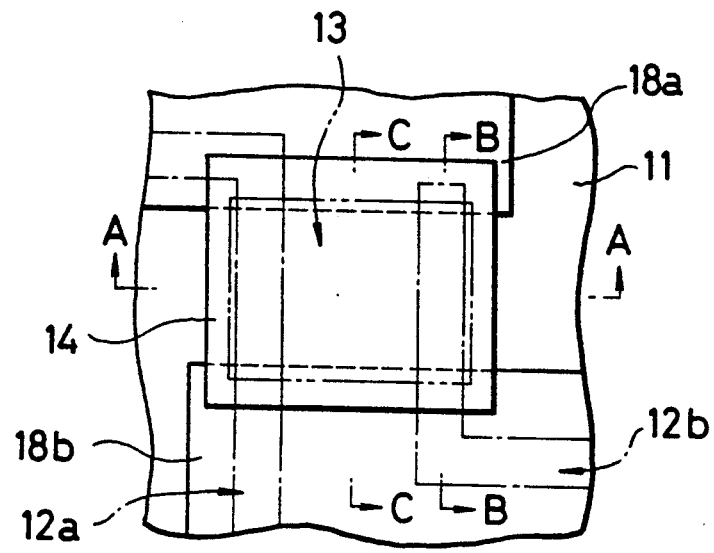
Figure 3B:
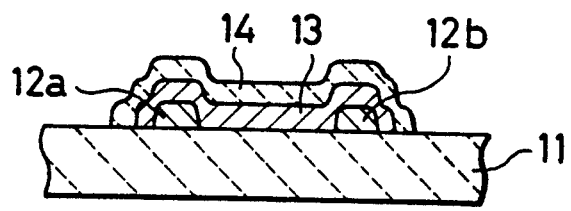
Figure 3C:
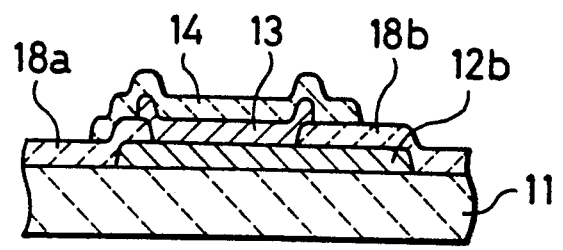
Figure 3D:
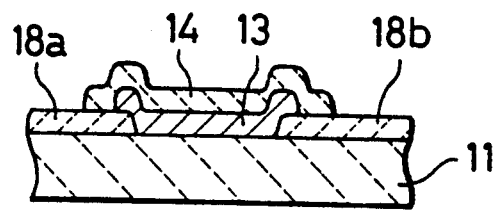

The both ends of the resistor 13 in the widthwise direction (direction perpendicular to the direction of connecting the both electrode portions) are, as shown in FIGS. 3c and 3d, laminated on the lower end of the covering member 18a and the upper end of the covering member 18b. In the portions of the covering members 18a and 18b where to be laminatedly formed on the conductors 12a and 12b, as shown in FIG. 3c, the resistor 13 is formed on the first covering members 18a and 18b which are already laminated on the conductors 12a and 12b. On the other hand, in the portions thereof where not to be laminatedly formed thereof, as shown in FIG. 3d, the resistor 13 is formed on the first covering members 18a and 18b which are already formed on the insulating substrate 11. As shown above, the resistor 13 has its both ends laminatedly formed on the covering members 18a and 18b, so that the boundaries of the electrode portions of the conductors 12a and 12b and the covering members 18a and 18b can be confirmedly protected by the resistor 13.

On the surface of the resistor 13, a second covering member 14 formed of the same amorphous glass as that in the conventional one is provided. This second covering member 14 is, as shown in FIG. 3a, is formed in a rectangular form larger than that of the resistor 13 to completely cover the surface thereof. As recognized from FIGS. 3b, 3c and 3d, the second covering member 14 has the peripheral edge superposed onto the insulating substrate 11 or the first covering members 18a and 18b.

Though not shown here, the conductor of the thick film hybrid IC device of this embodiment has other exposed sections, some ones of which are for carrying assembling parts thereon and the other ones of which are for connecting input/output terminals thereto. However, a protection film of an organic resin is not provided.

In addition in this embodiment, the conductors 12a and 12b, resistor 13, first covering members 18a and 18b, and second covering member 14 form a thick film resistive element. The insulating substrate and this resistive element formed thereon constitute a thick film printed circuit board. Then, assembling parts are carried on and input/output terminals are connected to the thick film printed circuit board thereby to make a thick film hybrid IC device.

In this embodiment, as explained above, the electrode portions of the conductors 12a and 12b are completely covered with two such high density films as the resistor 13 and second covering member 14. On the other hand, each of the portions of the conductors 12a and 12b where the first covering member 18a or 18b and resistor 13 are laminatedly formed is covered with such three films as the first covering member 18a or 18b, resistor 13 and second covering member 14. The other portions than above of the conductors 12a and 12b are covered with such one film as the first covering member 18a or 18b, or with such two films as the first covering member 18a or 18b and second covering member 14.

Accordingly, in this embodiment, there does not exist any section where the conductors are covered with the amorphous glass film only as in a conventional one, and it is necessarily covered with at least one of the high density resistance film and crystal glass film. This means that the thick film resistive element of this embodiment is less influenced by the moisture in the application environment than conventional ones, thus being superior in moisture resistance characteristic. The thick film printed circuit board including this element is also superior in moisture resistance characteristic to conventional ones. In addition, the thick film hybrid integrated circuit device using this element has an assembling part carrying pad portion and input/output terminal connection point covered with solder (not shown), so that the entrance of moisture therefrom does not arise any problem, and as a result, this device is superior in moisture resistance characteristic to conventional ones as well, thus being capable of omitting the protection film of an organic resin.

Production Method of First Embodiment

The thick film hybrid IC device as described above is produced as follows;

First, on an insulating substrate 11, an electroconductive paste is applied to pattern an electroconductive film by the screen printing technique, then dried the film and thereafter, fired at 850° C. Thus, two conductors 12a and 12b are formed in respective shapes as shown in FIG. 3a.

Next, by the screen printing technique, a crystal glass paste is applied onto the insulating substrate 11, then dried and thereafter, fired at 850° C. thus forming covering members 18a and 18b in respective shapes as shown in FIG. 3a. In this step of process, the conductors 12a and 12b are almost all covered with the covering members 18a and 18b excepting the electrode portions thereof shown in FIG. 3a.

Besides, in FIG. 3a, only the electrode portions of the conductors 12a and 12b to be bonded to the resistor 13 are shown as to be exposed, but in a practical case, the other electrode portions (not shown) than above are exposed, and furthermore, an assembling part carrying pad portion and terminal connection point are exposed in a similar manner that is shown here. The exposed portions of the conductors 12a and 12b become electrodes, assembling part carrying pad portions or terminal connection points according to the application purpose.

Subsequently, by the screen printing technique, a resistive paste is applied onto the insulating substrate 11, then dried, and thereafter, fired at 850° C., thus forming the resistor 13 in the shape as shown in FIG. 3a. The resistor 13 completely covers the electrode portions of the conductors 12a and 12b in the lengthwise direction thereof, and at the same time, is slightly extended from these electrode portions toward the insulating substrate 11. On the other hand, in the widthwise direction, the resistor 13 is patterned so as to be slightly superposed onto the first covering members 18a and 18b formed of a crystal glass.

Next, by the screen printing technique, an amorphous glass paste is applied onto the resistor 13 so as to cover it completely, then dried and thereafter, fired at 500° C., thus forming the second covering member 14 in the shape as shown in FIG. 3a. Thus, the thick film printed circuit board of this embodiment is obtained. In this case, the second covering film 14 is patterned so that the peripheral edge thereof is superposed onto the insulating substrate 11 or the first covering members 18a and 18b.

Then, the resistance value of the resistor 13 is adjusted by performing the laser trimming process, and then, step of carrying an assembling part thereon and a step of providing input/output terminal connection points are carried out. Thus, the thick film hybrid IC device of this embodiment is finished. In this production method, a step of forming a protection film using an organic resin, which would be used in the prior art, is not introduced.

In the assembling part carrying step, an assembling part is soldered onto the part carrying pad portion of each conductor, which means that the pad portion is covered with solder. In addition, in the input/output terminal connection step, an input/output terminal is soldered to the terminal connection point of each conductor, which means that the terminal connection point is covered with solder as well.

In this embodiment, a resistance R of the thick film resistive element is determined depending on a space L between the conductors 12a and 12b (length of the resistor), a space W between the first covering members 18a and 18b formed of a crystal glass (width of the resistor) and the sheet resistance ρ of the resistor 13, or can be expressed as follows:

$$R = A \cdot \rho \cdot (L/W),$$

where A is a correction constant.

Second Embodiment

Figure 4A:
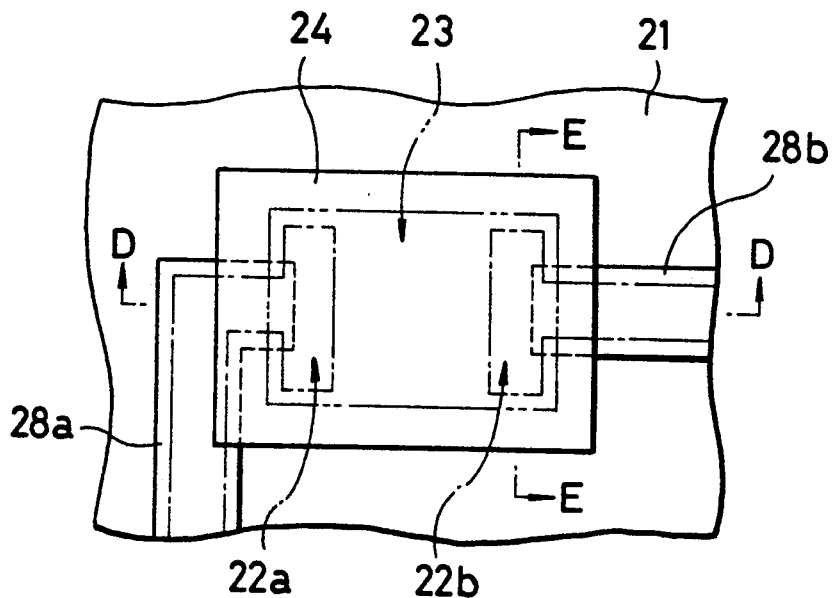
Figure 4B:
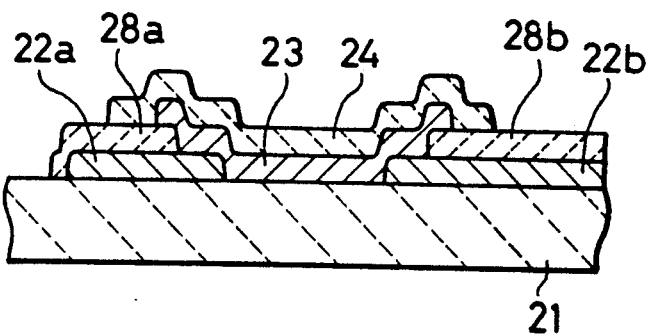
Figure 4C:
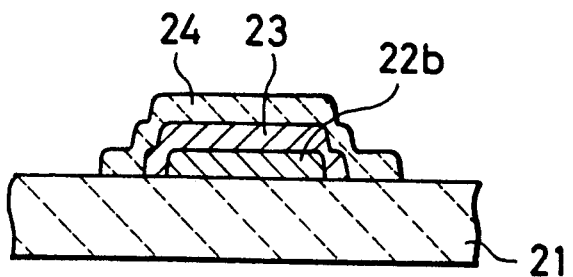

FIGS. 4a to 4c show a thick film hybrid integrated circuit device according to a second embodiment of this invention. The device of this embodiment is different in crystal glass film pattern in the vicinity of a resistor from that in the first embodiment.

In FIG. 4a, on an insulating substrate 21 are spatially patterned an electric conductor 22a substantially L-shaped and an electric conductor 22b linearly shaped. The conductors 22a and 22b have rectangular sections substantially parallel and close to each other formed on respective ends thereof. The rectangular sections thus formed are larger in width than the other sections of the conductors 22a and 22b.

First covering members 28a and 28b are formed of a crystal glass material on the insulating substrate 21 so as to cover the conductors 22a and 22b excepting the electrode portions to be bonded to a resistor 23.

The resistor 23 is formed in a rectangular shape on the insulating substrate 21 between the electrode portions of the conductors 22a and 22b so as to be laminated on the electrode portions at the both ends thereof. In this case, the resistor 23 is provided thereon so that the both ends thereof in the lengthwise direction (direction of connecting the both electrode portions) are slightly extended outside of respective electrode portions of the conductors 22a and 22b thereby covering them completely as shown in FIGS. 4b and 4c. The resistor 23 is contacted to the surface of the insulating substrate 21 between the electrode portions of the conductors 22a and 22b. In addition, the respective lengthwise ends of the resistor 23 are laminatedly provided on the portions of the first covering members 28a and 28b where to be formed on the conductors 22a and 22b.

The both ends of the resistor 23 in the widthwise direction thereof (direction perpendicular to the direction of connecting the both electrode portions) are contacted to the surface of the insulating substrate 21 as shown in FIG. 4c.

Different from the first embodiment, the widths of respective electrode portions of the conductors 22a and 22b are determined not depending on the covering members 28a and 28b formed of crystal glass but on the resistor 23.

On the surface of the resistor 23 is provided with a second covering member 24 formed of an amorphous glass as in the prior art. The covering member 24 thus provided is formed in a rectangular shape large than the resistor 23 thereby to cover it completely as shown in FIG. 4a. As recognized from FIGS. 4b and 4c, the peripheral edge portion of the second covering member 24 is laminated on the insulating substrate 21 or the first covering members 28a and 28b.

Similar to the first embodiment, though not shown, the respective conductor of the thick film hybrid IC device of this embodiment also has a plurality of exposed portions, some ones of which are to be used for carrying assembling parts thereon and the other ones of which are to be used for providing input/output terminal connection points. This device is not provided with a protection film formed of an organic resin.

In this embodiment, the conductors 22a and 22b, resistor 23, first covering members 28a and 28b and second covering member 24 form a thick film resistive element. And, the insulating substrate 21 including the element forms a thick film printed circuit board. Then, assembling parts are carried on and input/output terminal are connected to the printed circuit board thereby to make a thick film hybrid IC device.

In the second embodiment, the electrode portions of the conductors 22a and 22b are completely covered with such two high density films as the resistor 23 and second covering member 24. On the other hand, each of the portions of the conductors 22a and 22b where the first covering members 28a and 28b and resistor 23 are laminatedly formed thereon is covered with such three films as the first covering member 28a and 28b, resistor 23 and second covering member 24. The other portions than those of the conductors 22a and 22b are covered with such one film as the first covering member 18a or 18b, or with such two films as the first covering member 28a or 28b and second covering member 24.

Accordingly, in the thick film hybrid IC device of this embodiment, there does not exist any section where the conductor is covered with the amorphous glass film only, and it is necessarily covered with at least one of the high density resistance film and crystal glass film, thus being capable of obtaining the same effects as in the first embodiment. Besides, this embodiment is advantageous in that the pattern design of the resistive element can be more easily made than the preceding embodiment.

Production Method of Second Embodiment

The production method of a thick film hybrid IC device of the second embodiment is identical to that of the first embodiment excepting that the pattern of conductor, resistor or the like is different therefrom. Namely, on the insulating substrate 21, the conductors 22a and 22b shaped as shown in FIG. 4a, first covering members 28a and 28b of a crystal glass shaped as shown in FIG. 4a, the resistor 23 and second covering member 24 are formed in this order. Thus, the thick film printed circuit board of this embodiment can be obtained. Then, the resistance of the resistor 23 is adjusted by trimming and thereafter, a step of carrying assembling parts and a step of connecting input/output terminals are accomplished thereby finishing the thick film hybrid IC device of this embodiment. A protection film formed of an organic resin is not provided. Through the assembling part carrying and input/output terminal connecting steps, the part carrying pad portion and terminal connection point of each electroconductive film are respectively covered with solder.

In the second embodiment, similar to the first embodiment, the resistance R of the thick film resistive element is determined depending on the space L between the conductors 22a and 22b (length of the resistor), the space W between the first covering members 28a and 28b formed of a crystal glass (width of resistor) and the sheet resistance $\rho$ of the resistor 23, can be expressed as follows:

$$R = A \cdot \rho \cdot (L/W),$$

where A is a correction constant.

Test

In order to make sure of the effects of this invention, thick film resistive elements according to the first embodiment and those according to the prior art (not provided with the protection film coated) were prepared for the testing specimens. Those specimens were subjected to moisture resistance test for the insulation resistance comparison purpose.

In this comparison test, 100 elements were prepared for each of the first embodiment and the prior art. Each specimen was of a rectangle with a length of 1 mm and a width of 1 mm, and had a resistance of about 100 k$\Omega$. The conductor was formed of an electroconductive paste containing silver 99.3% - platinum 0.7% alloy powder as the main component.

The tests were made under the application of a direct-current voltage of 50 V to the resistor at 85° C. and 85% RH. Through which, the resistance change of each specimen was checked based on the criterion that the resistance change exceeds $\pm 0.3\%$ after testing for 1000 hours.

The results were that referring to the elements according to the prior art, 5 out of 100 specimens exceeded this range and on the other hand, referring to the elements of this invention, no specimen exceeded this range. This means that the thick film resistive element of this invention is outstandingly superior in moisture resistance characteristic and even if a protection film of an organic resin is not formed, it is provided with a moisture resistance characteristic that is suitably resistant on a practical bases. As a result, it can be recognized that the introduction of the thick film resistive elements of this invention makes it possible to provide a thick film printed circuit board and a thick film hybrid IC device which are outstandingly superior in moisture resistance characteristic and able to use without a protection film of an organic resin.

In the two above-explained embodiments, the effects of this invention are particularly outstanding when a silver system material such as silver-palladium alloy and silver-platinum alloy was used as the electroconductive film, which is resulted from the fact that the silver is large in ionization tendency. However, this invention is not limited thereby, but applicable to an electroconductive film material other than the silver system ones.

In addition, the above explanations were made with the resistor as the center, but this invention is not limited thereto and as a result, the same effects can also be obtained in a thick film printed circuit board and thick film hybrid IC device in which the portions of the conductors excepting the part carrying pad portion and terminal connection point including the resistor are covered with the covering members formed of a crystal glass.

What is claimed is:

1. A thick film resistive element comprising:
   an insulating substrate;
   a pair of thick film conductors formed on said substrate, each of said conductors having electrode portions;
   a thick film resistor formed on said substrate which partially overlaps said electrode portions of said pair of conductors thereby covering surfaces of said electrode portions; and
   a first covering member formed of a material containing a crystal glass as a main ingredient thereof which covers said pair of conductors other than said electrode portions;
   said first covering member not covering a surface of said resistor.

2. A thick film resistive element as claimed in claim 1, wherein said resistor partially overlaps said first covering member.

3. A thick film resistive element as claimed in claim 2, wherein said resistor extends over said electrode portions to make contact with a surface of said substrate.

4. A thick film resistive element as claimed in claim 3, wherein a second covering member formed of an amorphous glass material additionally covers said resistor.

5. A thick film resistive element as claimed in claim 3, wherein said first covering member is in contact with both of said pair of conductors.

6. A thick film resistive element as claimed in claim 3, wherein a plurality of said first covering members are provided, and said first covering members are in contact with said pair of conductors respectively.

7. A thick film printed circuit board comprising:
   an insulating substrate;
   thick film conductors formed on said substrate, each of said conductors having electrode portions;
   a thick film resistor formed on said substrate which partially overlaps and covers respective ones of said electrode portions; and
   a first covering member formed of a material containing a crystal glass as a main ingredient thereof for covering said pair of said conductors at other than said electrode portions, a part carrying pad portion, and a terminal connection point.

8. A thick film integrated circuit device comprising:
   a thick film printed circuit board as claimed in claim 7 and an assembly of parts carried on said circuit board; and
   input/output terminals connected to said circuit board.

9. A method of producing a thick film resistive element, comprising the steps of:
   forming a patterned electroconductive film on an insulating substrate to form a pair of conductors;
   forming a patterned film of a material containing a crystal glass as a main ingredient thereof on said substrate with electrode portions of said conductors respectively being exposed; and
   forming a patterned resistance film on said substrate to link said electrode portions to each other for bonding said resistance film to said respective electrode portions as well as covering said electrode portions therewith.

10. A method of producing a thick film printed circuit board, comprising the steps of:
    forming a patterned electroconductive film on an insulating substrate in order to form conductors;
    forming a patterned film of a material containing a crystal glass as a main ingredient thereof on said substrate, said conductors having exposed respective electrode portions, a part carrying pad portion, and an input/output terminal connection point of said conductors; and
    forming a patterned resistance film on said substrate to link said electrode portions to each other for bonding said resistance film to said respective electrode portions as well as covering said electrode portions therewith.

11. A method of producing a thick film hybrid integrated circuit device, comprising the steps of:
    fabricating a thick film printed circuit board as claimed in claim 10;
    assembling parts on said circuit board; and
    connecting input/output terminals on said circuit board.

* * * * *